United States Patent
Becker et al.

(10) Patent No.: US 11,307,505 B2
(45) Date of Patent: Apr. 19, 2022

(54) METHOD FOR OPERATING AN OPTICAL APPARATUS, AND OPTICAL APPARATUS

(71) Applicant: Carl Zeiss SMT GmbH, Oberkochen (DE)

(72) Inventors: Moritz Becker, Aalen (DE); Stefan-Wolfgang Schmidt, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/790,107

(22) Filed: Feb. 13, 2020

(65) Prior Publication Data

US 2020/0183292 A1    Jun. 11, 2020

Related U.S. Application Data

(63) Continuation of application No. PCT/EP2018/070220, filed on Jul. 25, 2018.

(30) Foreign Application Priority Data

Aug. 15, 2017   (DE) ............ 10 2017 214 215.4

(51) Int. Cl.
*G03F 7/20* (2006.01)
*G01N 29/02* (2006.01)

(52) U.S. Cl.
CPC ....... *G03F 7/70883* (2013.01); *G01N 29/022* (2013.01); *G03F 7/7085* (2013.01);
(Continued)

(58) Field of Classification Search
CPC .......... G01N 2291/0256; G01N 27/12; G01N 29/022; G01N 29/2443; G03F 7/7085;
(Continued)

(56) References Cited

U.S. PATENT DOCUMENTS

| | | |
|---|---|---|
| 5,397,541 A | 3/1995 | Post |
| 2009/0231707 A1 | 9/2009 | Ehm et al. |
| 2017/0212433 A1 | 7/2017 | Ehm et al. |

FOREIGN PATENT DOCUMENTS

| | | |
|---|---|---|
| DE | 102006044591 A1 | 4/2008 |
| DE | 102014114572 A1 | 4/2016 |

(Continued)

OTHER PUBLICATIONS

PCT International Search Report and the Written Opinion, PCT/EP2018/070220, dated Nov. 2, 2018, 15 pages.
(Continued)

*Primary Examiner* — Michelle M Iacoletti
(74) *Attorney, Agent, or Firm* — Edell, Shapiro & Finnan LLC

(57) ABSTRACT

A method for operating an optical apparatus (100A, 100B, 200), having a structural element (201) which is arranged in a residual gas atmosphere (RGA) of the apparatus and which is formed at least partly from an element material subjected to a chemical reduction process and/or an etching process with a plasma component (PK) present in the residual gas atmosphere includes: feeding (S2) a gas component (GK) that at least partly suppresses the reduction process depending on a detected suppression extent (UM) for a suppression of the etching process and/or reduction process by the suppressing gas component in the residual gas atmosphere; and detecting (S1) the suppression extent with a sensor unit (208) arranged in the residual gas atmosphere. The sensor unit includes a sensor material section (211) composed of a sensor material and exhibiting a sensor section property that is measurable under the influence of the suppressing gas component.

29 Claims, 8 Drawing Sheets

(52) U.S. Cl.
CPC ...... *G03F 7/70908* (2013.01); *G03F 7/70983* (2013.01); *G01N 2291/0256* (2013.01)

(58) Field of Classification Search
CPC ............. G03F 7/70883; G03F 7/70908; G03F 7/70983; G03F 7/70033; G03F 7/70841; G03F 7/70916; G03F 7/70925
See application file for complete search history.

(56) References Cited

FOREIGN PATENT DOCUMENTS

| | | |
|---|---|---|
| JP | 6059148 B2 | 1/2017 |
| WO | 2008105119 A1 | 9/2008 |
| WO | 2013035304 A1 | 3/2013 |

OTHER PUBLICATIONS

Veprek et al., "Role of oxygen impurities in etching of silicon by atomic hydrogena", JVSTA, (2008), 9 pages.
Feng et al., "Gas Sensors Based on Semiconducting Nanowire Field-Effect Transistors", Sensors 2014, 14, 24 pages.

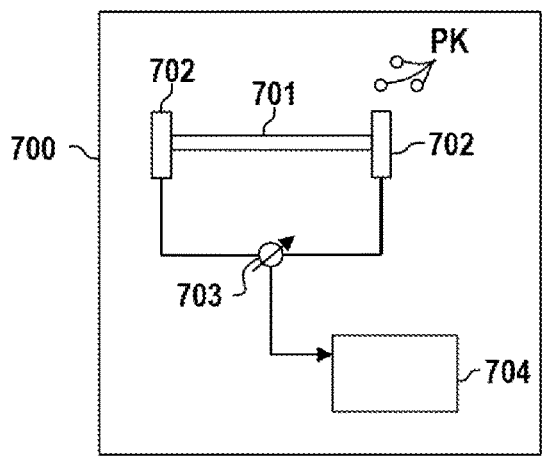
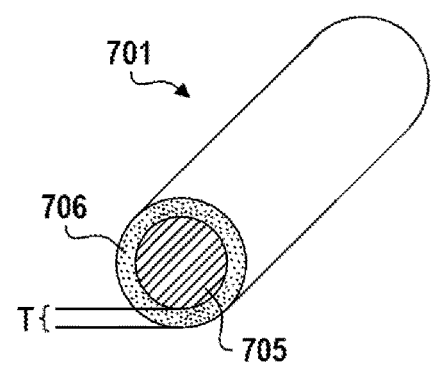
Fig. 7A
Fig. 7B
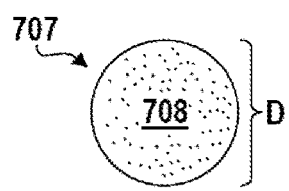
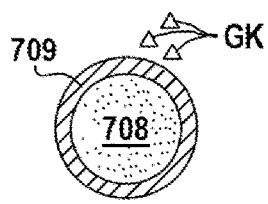
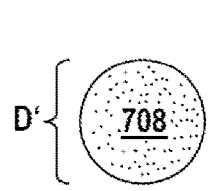
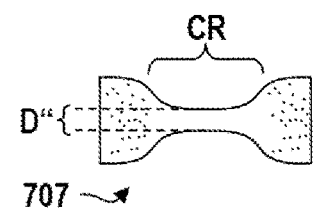
Fig. 7C
Fig. 7D
Fig. 7E
Fig. 7F
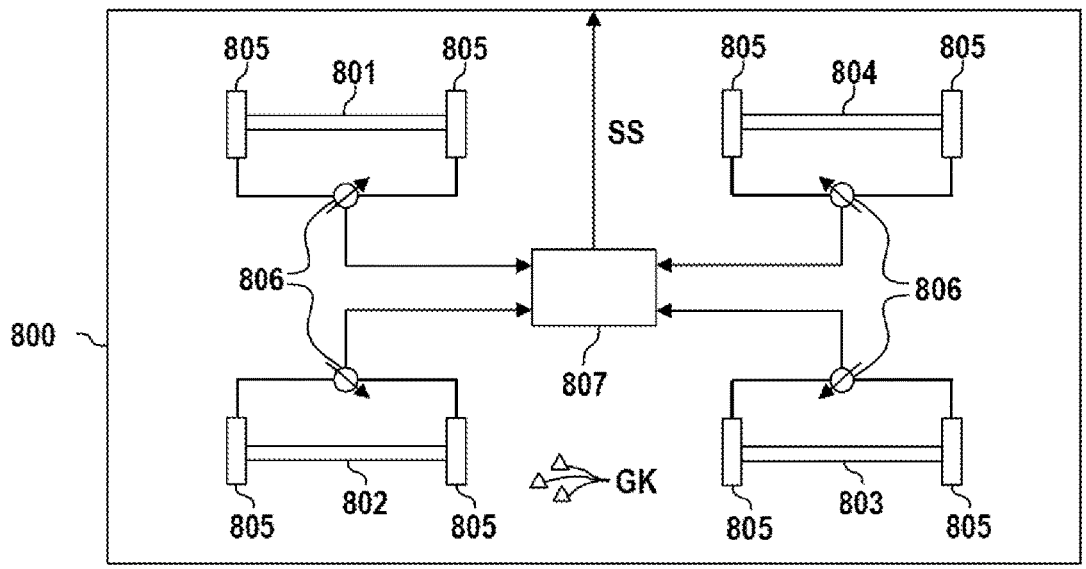
Fig. 8

METHOD FOR OPERATING AN OPTICAL APPARATUS, AND OPTICAL APPARATUS

CROSS REFERENCE TO RELATED APPLICATIONS

This is a Continuation of International Application PCT/EP2018/070220, which has an international filing date of Jul. 25, 2018, and which claims the priority of German Patent Application 10 2017 214 215.4, filed Aug. 15, 2017. The disclosures of both applications are incorporated in their respective entireties into the present Continuation by reference.

FIELD OF THE INVENTION

The present invention relates to a method for operating an optical apparatus, in particular a lithography apparatus, such as an EUV lithography system or a mask inspection system, and also to an optical apparatus.

BACKGROUND

Microlithography is used for producing microstructured components, for example integrated circuits. The microlithographic process is performed using a lithography apparatus, which has an illumination system and a projection system. The image of a mask (reticle) illuminated by the illumination system is in this case projected by the projection system onto a substrate (for example a silicon wafer) which is coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are optical EUV apparatuses that use light with a wavelength in the range from 0.1 nm to 30 nm, in particular 13.5 nm. In the case of such EUV lithography or mask inspection apparatuses, because of the high absorption of light of this wavelength by most materials, reflective optical units, that is to say mirrors, have to be used instead of—as previously—refractive optical units, that is to say lens elements.

The absorption length of EUV radiation in air for example at normal pressure is less than one millimetre. It is therefore necessary for the EUV radiation used for imaging to be guided to the greatest possible extent in evacuated atmospheres under an ultrahigh vacuum (UHV). The used optical units with their mounts and sensor arrangements are therefore arranged in a vacuum chamber enclosing the residual gas atmosphere. The remaining substances in the residual gas atmosphere, in particular hydrogen, can be ionized and excited under the influence of the EUV light, thus resulting in the formation of plasmas that are aggressive to materials present in the vacuum chamber. In some instances it is also desirable to feed specific gas components to the residual gas atmosphere of the lithography system, in order for example to achieve a cleaning effect. In this case, hydrogen, in particular, is used as purge gas. However, the hydrogen plasma that forms in the residual gas atmosphere of the apparatus can attack and in some instances damage the materials used for component parts within the apparatus. On account of the hydrogen plasma, in this respect outgassing of contaminating substances can arise, which deposit for example on optical surfaces of optical elements and impair the transmission properties there.

It is known, for example, that silicon can be etched by aggressive hydrogen plasma and can precipitate with formation of gaseous silanes and oxidation in an undesired manner within the EUV exposure system. In the past, therefore, oxygen has been fed into the residual gas atmosphere in order to reduce the etching and dissolution of silicon.

DE 10 2014 114 572 A1 discloses an EUV lithography system equipped with a feed unit for an oxygen-containing gas into the vacuum environment. In that case, a specific oxygen partial pressure is set in the region of a silicon-containing surface. One difficulty in the metering is that comparatively too much oxygen within the vacuum environment can lead to undesired oxidations. It is desirable, therefore, firstly to detect the composition present within the vacuum atmosphere with regard to the etching substances, such as plasma constituents, for example, and also the gases that decrease such undesired etching processes, such as oxygen.

In accordance with DE 10 2006 044 591 A1, the contamination of a reflective optical element in an EUV lithography apparatus is decreased by gas-binding material arranged on an inner side of the vacuum housing.

Overall, it remains desirable to decrease the contamination within the respective optical apparatus, such as a lithography or mask inspection apparatus, by substances stripped from component parts by plasma constituents and to counteract this contamination in a targeted manner.

SUMMARY

Against this background, it is an object of the present invention to provide an improved method for operating an optical apparatus, such as, in particular, a lithography or mask inspection apparatus, and an optical apparatus suitable therefor.

Accordingly, a method for operating an optical apparatus, in particular a lithography or mask inspection apparatus, is proposed, said apparatus comprising a structural element arranged in a residual gas atmosphere of the optical apparatus, wherein the structural element is formed at least partly from an element material which is subjected to a chemical etching process, in particular a reduction process as precursor stage to the actual etching process, with a plasma component present in the residual gas atmosphere. The method comprises the following steps:

feeding a gas component that at least partly suppresses the reduction process and/or etching process depending on a detected suppression extent for a suppression of the reduction process and/or etching process by the suppressing gas component in the residual gas atmosphere; and detecting the suppression extent with the aid of a sensor unit arranged in the residual gas atmosphere, said sensor unit comprising a sensor material section composed of a sensor material, wherein the sensor material section has a sensor section property that is measurable under the influence of the suppressing gas component.

Furthermore, an optical apparatus, in particular a lithography or mask inspection apparatus, is proposed, which comprises:

a housing closing off a residual gas atmosphere;
a structural element which is arranged in the residual gas atmosphere and which is formed at least partly from an element material which is subjected to a chemical reduction process and/or etching process with a plasma component present in the residual gas atmosphere;

a feed unit for feeding a gas component that at least partly suppresses the reduction process and/or etching process into the residual gas atmosphere; and a sensor unit arranged in the residual gas atmosphere, said sensor unit comprising a sensor material section composed of a sensor material, wherein the sensor material section has a measurable sensor section property that varies under the influence of the suppressing gas component.

In embodiments, the optical apparatus is furthermore equipped with a control unit configured to control the feed unit in such a way that a method as described above or below is carried out.

Within the residual gas atmosphere, ionized hydrogen, in particular, can be present as plasma component, but other plasma components are also conceivable which have an etching effect on the respective element material of a structural element incorporated in the optical apparatus, such as a lithography or mask inspection apparatus.

Element materials are for example oxide materials, such as silicon dioxide, aluminium oxide, tin oxide, or zinc oxide. Element materials can furthermore comprise phosphorus or zirconium in oxidic form. Carbide materials are likewise possible, e.g. SiC. Structural elements in lithography or mask inspection apparatuses are, in particular, optical elements for EUV lithography or EUV mask inspection, wherein the structural elements are preferably fabricated from materials having low coefficients of thermal expansion. Doped silicate glasses, for example silicates doped with titanium dioxide and referred to as quartz glass, for example, are known in this context. Glasses of this type are available as ULE (ultra low expansion) glass from Corning. Sapphire structural elements composed of aluminium oxide are also conceivable.

The element material can also consist of a glass ceramic in which a ratio of the crystal phase to the glass phase containing silicon dioxide is set in such a way that the mutually opposing coefficients of expansion of the different phases in a temperature range virtually cancel one another out in an expedient manner. The temperature range is then determined such that a material exhibiting particularly little geometric variation results during typical operating temperatures within the optical apparatus, such as e.g. 20° C. to 160° C. Such glass ceramics are available under the trade name Zerodur from Schott AG or under the trade name ClearCeram from Ohara. Such element materials typically contain silicon compounds usually in the manner of silicon dioxide, which can be stripped out or etched away under the influence of hydrogen as plasma component and can pass into the residual gas atmosphere.

Contamination of such stripped element material constituents, such as silicon, and the undesired depositing thereof on surfaces within the optical apparatus are combatted by feeding of the gas referred to as suppressing gas component. In embodiments, oxygen and/or water are/is used as suppressing gas component.

It has been found that, for example, silicon-containing silicon dioxide as element material firstly is chemically reduced to silicon by a combination of hydrogen radicals and hydrogen ions in the plasma present in the residual gas atmosphere, said silicon subsequently undergoing transition as a hydride or silane into the residual gas atmosphere. Investigations by the applicant have revealed that a gas component that suppresses this reduction process, in particular oxygen and/or water, reduces the hydrogen-dictated outgassing of element materials and hence the depositing of the reduced element material within the optical apparatus.

In this case, the effectiveness of the suppression of the chemical reduction process of the element material with the plasma component is dependent on the amount of the gas component introduced into the residual gas atmosphere. In order to feed the suppressing gas component, such as oxygen gas, for example, expediently into the residual gas atmosphere of the ultrahigh vacuum of the optical apparatus configured as a lithography or mask inspection apparatus for EUV light, for example, a suppression extent is detected. This enables an optimum metering of the suppressing gas component. In this case, measurement of all gas constituents present in the residual gas atmosphere is desirable in principle. The detection of all gas constituents and plasma components within the residual gas atmosphere in the context of a residual gas analysis is very complex in a conventional manner, however, during the operation of a lithography apparatus. By way of example, methods such as X ray photoelectron spectroscopy (XPS), on account of the complexity of the spectrometers, cannot be used either in a beam shaping and illumination system or in a projection system of a lithography or mask inspection apparatus. In the method proposed, however, use is made of a sensor unit that detects the effect of the introduced gas component for inhibiting the etching and/or chemical reduction process. In this respect, the sensor unit serves for detecting the chemical reaction to be monitored and can be positioned flexibly in the vicinity of attacked surfaces. Conventional residual gas analysis measurements e.g. using mass spectroscopy can generally only detect gas compositions at specific locations in an optical apparatus, with the result that the actual effect on materials in the residual gas atmosphere may remain unidentified.

In embodiments, the sensor material section is arranged no further than 1 m, preferably no further than 0.5 m, and particularly preferably no further than 30 cm, away from a surface of the structural element that is exposed to the plasma component.

Optionally, the method involves carrying out, in particular, detection of the precursor stage to the actual etching process and an adaptation of the feeding of the at least partly suppressing gas component depending on the detection.

In order then to detect a suppression extent for the effectiveness and the course of the chemical reduction process which precedes stripping of the element material into the gas phase, by addition of the suppressing gas component, a sensor unit within the residual gas atmosphere is proposed. In this case, use is made of a sensor material that is exposed to the reducing plasma component and/or the suppressing gas component in the residual gas atmosphere to the same extent as affected structural elements. The alteration of the sensor material is measured as sensor section property. That is to say that the influence of the plasma components and/or of the suppressing gas components is directly detected within the optical apparatus, for example in proximity to the structural elements attacked by the plasma components. A suppression extent can be derived therefrom, such that from this knowledge the amount of suppressing gas component can be suitably fed in. Overall this results in operation of the optical apparatus in which the contamination of surfaces by element material removed from structural elements is decreased.

In embodiments, the sensor section property is an electrical conductivity of the sensor material section, a thickness of the sensor material section on a substrate, an optical reflection or transmission coefficient and/or a mass of the sensor material section.

The influence or the effect of the plasma component, such as hydrogen plasma, present in the residual gas atmosphere on a element material, such as silicon dioxide of a mirror body, is simulated as it were with the aid of the sensor material section. Advantageously, the sensor material section can be embodied as significantly smaller than the surfaces of the structural elements that are exposed to the plasma.

As a result of the determination of the suppression extent, the suppressing gas component, such as, for example, the oxygen, can then be metered on the basis of the knowledge of the influence on the sensor material such that the element material is attacked by the plasma to a lesser extent.

In embodiments, the sensor material is configured to be reduced or oxidized under the influence of the plasma component and/or the suppressing gas component in the sensor material section, wherein for example a material removal is carried out.

It is conceivable, for example, for the sensor material to be formed from an element material and to be subjected to the same chemical reduction process as the respective structural element. It is also possible for the sensor material to be oxidized in particular by the gas component, for example oxygen, and hence to become detached or for the density or mass of the sensor material section to change. The sensor material is chosen in particular such that a sensor section property is measurable which correlates with the desired process implementation within the optical unit and thus constitutes a controlled variable for feeding the suppressing gas component or operation of the optical apparatus, in particular as an EUV lithography or mask inspection apparatus.

In this respect, in embodiments, the method furthermore comprises the following steps:
measuring the sensor section property; and
determining a substance amount to be fed of the suppressing gas component in the residual gas atmosphere depending on the measured sensor section property for detecting the suppression extent.

On account of an alteration of the sensor section property, for example a mass or an optical property as a result of, in particular, oxidation with the gas component, which is dependent on the substance amount fed or the partial pressure thereof in the residual gas atmosphere, it is possible to define a suitable suppression extent.

In embodiments, the suppression extent is detected as a ratio of the proportion of the plasma component and the proportion of the suppressing gas component in the residual gas atmosphere. Preferably, the ratio of the partial pressures can be detected as the suppression extent. It is possible, in particular, to derive the ratio of the partial pressures from the measured sensor section property.

In a further variant of the method, the following steps are carried out:
measuring the sensor section property; and
mapping the measured sensor property onto the suppression extent.

In this case, the mapping comprises for example:
the use or the application of a mapping specification,
the use or the application of a reaction model for the influence of the suppressing gas component and/or of the plasma component on the sensor material and/or the element material,
the use or the application of a heuristic model for the influence of the suppressing gas component and/or the plasma component on the sensor material and/or the element material and/or
the use or the application of a table in the manner of a mapping table.

A mapping specification can be implemented for example in such a way that, upon a reduction/oxidation of the sensor material being detected, a substance feed of the suppressing gas component is increased/reduced by a predetermined extent. In this case, the extent can be defined in relative fashion, e.g. in percent, or in absolute fashion.

In embodiments, the sensor section property is measured whilst utilizing a skin effect on the basis of an alternating-current measurement. By way of example, a current flow can vary as a result of the alteration of the sensor section material, which can be detected with the aid of electrical radio-frequency measurements.

In embodiments of the method, feeding the suppressing gas component is carried out in such a way that the detected suppression extent lies within a predefined range during operation of the optical apparatus.

The suppression extent can be specified within a suppression extent value, such as, for example, the ratio of partial pressures for the plasma component and the gas component or the remaining reduction rate at the sensor unit. Whilst monitoring the suppression extent with the aid of the sensor unit, the suppression extent is then preferably set into a range or value range. The suppression extent can change in particular as a result of the suppressing gas component being fed into the residual gas atmosphere.

In embodiments, the predefined range for the detected suppression extent is chosen in such a way that an etching process of the element material reduced on account of the reduction process is at least partly prevented.

In the case of the influence of the plasma component on the element material, such as, for example, the effect of a hydrogen plasma on silicon constituents, it is possible to make reference to an etching process. In this case, as indicated above, silicon reduced from silicon dioxide is stripped away into the residual gas atmosphere. This takes place in an atmosphere with hydrogen plasma with formation of silanes and further chemical processes explained below. It is also possible to make reference to dry etching.

In further embodiments, the lithography or mask inspection apparatus comprises at least one optical element having a mirror surface, the suppressing gas component is an oxidant, and wherein feeding the suppressing gas component is carried out in such a way that a deposition on the mirror surface of element material oxidized by the suppressing gas component and previously reduced by the plasma component is smaller than a predefined extent.

By way of example, by investigating the sensor material in the sensor section, it is possible to perform a "calibration", such that the etching effect of the plasma component can be deduced from a "consumption" of the sensor material or the change in the sensor section property. A reduced contamination of surfaces within the residual gas atmosphere can therefore be achieved by metering or feeding of the suppressing gas component depending on the suppression extent, which is likewise derived from the sensor section property.

In embodiments of the method, the lithography apparatus as optical apparatus has an illumination device for generating UV light, a reticle device for a photomask with lithographic information, and a projection device for imaging the lithographic information onto a wafer. The sensor unit is then preferably arranged in the projection device. In variants, the sensor unit is arranged where potential contamination sources for plasma components are present and in particular component parts may be subject to an etching process under exposure to plasma.

By comparison with known measuring arrangements for determining gas atmosphere constituents, such as, for example, mass spectrometry methods, the sensor unit can be arranged at different positions within a lithography or mask inspection apparatus in an expedient manner in respect of outlay.

The structural element can be for example an optical element, a mirror body, a mirror coating, a reticle mount, a reticle and/or a carrying element within a lithography or mask inspection apparatus.

In embodiments of the method and/or of the proposed optical apparatus, the sensor unit comprises a nanowire fabricated from the element material as sensor material as a sensor material section and a measuring unit for measuring an electrical resistance of the nanowire as sensor material section. In this case, the sensor material is configured such that it is reduced under the influence of the plasma component, wherein the resistance of the nanowire changes.

The nanowire can be formed for example from the element material or an element material oxide. A nanowire is understood to mean, in particular, an elongated wire-type element having in particular an average diameter of less than 1 preferably less than 500 nm, and more preferably less than 100 nm. By way of example, semiconductor or metal nanowires can be produced by etching processes or under catalytic growth.

In this case, the sensor unit detects in particular the resistance or the conductivity along the longitudinal direction of the nanowire or a current-voltage characteristic curve. If, by way of example, a material oxide is used as nanowire material, the resistance changes as a result of a chemical reduction of the oxide by the plasma component, such as by hydrogen, for example.

In a further embodiment, the sensor unit comprises a nanowire fabricated from the sensor material as a sensor material section and a measuring unit for measuring an electrical resistance of the nanowire as sensor material section property. The sensor material is configured in particular such that it is oxidized by the suppressing gas component to form a sensor material oxide, wherein the resistance of the nanowire changes. In this embodiment, too, it is possible to detect a current-voltage characteristic curve as sensor section property and to deduce therefrom in particular the proportion of the suppressing gas component and/or a ratio of the suppressing gas component and the plasma component in the residual gas atmosphere.

In embodiments, the nanowire is configured in such a way that the sensor material oxide is stripped from the sensor material. That is to say that a diameter of the nanowire decreases under the influence of the gas component and hence leads to chopping of the current flow through the nanowire, which can in turn be detected.

It is conceivable, in particular, to detect a skin effect on silicon nanotubes as nanowires. By way of example, the reactance and/or the conductivity of one or more nanotubes at frequencies of between 0 and 10 MHz are/is detected and the influence of the plasma and the suppressing gas component on the electrical properties is detected.

In embodiments, the sensor unit comprises a thin layer fabricated from the sensor material and arranged on a substrate as a sensor material section and a measuring unit for measuring an electrical resistance of the thin layer as sensor section property. The sensor material is preferably configured to be oxidized by the suppressing gas component to form a sensor material oxide, wherein the resistance of the thin layer changes. In this respect, the detection of a change in resistance or else of a current-voltage characteristic curve makes it possible to deduce the presence or the amount of the suppressing gas component in the residual gas atmosphere.

It is furthermore possible, in particular, to detect an optical property of the thin layer as sensor section property.

In embodiments, the sensor unit comprises a film fabricated from the sensor material as a sensor material section and a measuring unit for measuring an optical property as sensor section property.

Optical properties can be detected in particular in a non-contacting manner, thereby enabling a sensor unit which is expedient in respect of outlay and the read-out thereof. The sensor material of the film can be configured in particular to be oxidized by the suppressing gas atmosphere to form a sensor material oxide. With formation of the sensor material oxide, a sensor material oxide layer having a changing thickness arises, as a result of which the optical property of the surface can change, such that a good detection of the sensor section property is made possible.

It is furthermore conceivable for the sensor material to be configured to be reduced under the influence of the plasma component. A film which is fabricated in this way and the surface of which is reduced by the plasma component likewise alters its optical properties, which can be detected.

In embodiments, the sensor unit is configured to determine ellipsometric parameters as optical property for a surface of the film as sensor section property. In one variant of the sensor unit, an optical transmission or reflection property of the film is measured as sensor section property.

In yet another embodiment of the sensor unit, the sensor unit comprises a quartz crystal microbalance for measuring a sensor material removal from the sensor section under the influence of the suppressing gas component and/or the plasma component on the sensor material.

In the case of a quartz microbalance, a piezoelectric crystal, for example a quartz, is caused to oscillate by an AC voltage being applied. Since the respective resonant frequency of such an oscillating oscillator changes with varying mass, a change in mass of the sensor section attached to the quartz crystal microbalance can be detected. In this respect, in such an embodiment, a resonant frequency change, in absolute terms or as a difference (beat frequency) with respect to a reference quartz excluded from the change, is detected as a result of a chemical or mechanical change in the sensor section property.

Preferably, a ruthenium layer coated with silicon oxide is used in the case of the quartz crystal microbalance for detecting an etching and/or reduction process on silicon. The ruthenium leads to an expedient binding of silicon, with the result that a contamination by the sensor units into the residual gas atmosphere is precluded to the greatest possible extent.

Correspondingly adapted sensor units can be used for determining further contamination processes and the precursors thereof.

In embodiments, the residual gas atmosphere of the optical apparatus has a pressure of between $10^{-4}$ and 5 mbar.

The partial pressures, in particular of the suppressing gas component, are preferably between $10^{-10}$ and $10^{-7}$ mbar.

In embodiments, the feed unit comprises capillaries for metering in predetermined substance amount rates of the gas component from outside the residual gas atmosphere to within the latter.

In embodiments, the optical apparatus is an EUV lithography or mask inspection apparatus comprising a projection device for imaging lithographic information with the aid of EUV radiation.

In further embodiments, the lithography or mask inspection apparatus can be a DUV lithography or mask inspection apparatus. The lithography or mask inspection apparatus can comprise a plurality of feed units for suppressing gas components and/or sensor units.

In embodiments, the optical apparatus is a mask inspection apparatus comprising an illumination device for generating UV light, a reticle device for a photomask with lithographic information, and a projection device for imaging and for inspecting the lithographic information. The sensor unit is preferably arranged in the projection device.

In embodiments, the sensor unit is arranged in direct proximity to affected component parts in such a way that an exposure to the plasma component for the sensor unit corresponds to that for the respective component part.

EUV stands for "extreme ultraviolet" and refers to a wavelength of the working light of between 0.1 nm and 30 nm. DUV stands for "deep ultraviolet" and refers to a wavelength of the working light of between 30 nm and 250 nm.

"A(n)" in the present case should not necessarily be understood as restrictive to exactly one element. Rather, a plurality of elements, such as, for example, two, three or more, can also be provided. Any other numeral used here, too, should not be understood to the effect that an exact restriction to exactly the corresponding number of elements must be realized. Rather, numerical deviations upwards and downwards are possible.

A chemical reduction process is understood to mean, in particular, a reaction in which a substance accepts electrons and is reduced in the process. Oxidation is understood to mean a chemical reaction in which a substance to be oxidized (electron donor) releases electrons. Another substance (oxidant) accepts the electrons (electron acceptor). The latter is reduced as a result of accepting the electrons. Both reactions together are regarded in particular as partial reactions of a redox reaction. An oxidation can, but need not, be carried out using oxygen as oxidant. Sulfur or halogens is or are also conceivable as oxidant.

As etching process to be reduced with the aid of a suppressing component, it is appropriate in particular to convert silicon into gaseous silanes within the residual gas atmosphere. A zinc, tin, phosphorus, copper, manganese, magnesium or zirconium material removal through exposure to hydrogen ions in the respective residual gas atmosphere is also possible.

Further possible implementations of the invention also comprise not explicitly mentioned combinations of features or embodiments that are described above or below with respect to the exemplary embodiments. In this case, the person skilled in the art will also add individual aspects as improvements or supplementations to the respective basic form of the invention.

Further advantageous configurations and aspects of the invention are the subject matter of the dependent claims and also of the exemplary embodiments of the invention described below. In the text that follows, the invention is explained in more detail on the basis of preferred embodiments with reference to the accompanying figures.

BRIEF DESCRIPTION OF THE DRAWINGS

FIGS. 7A-7F show schematic illustrations of embodiments of measuring units in which different sensor materials are exposed to the plasma components for use in a lithography apparatus in accordance with FIG. 2, specifically a nanowire in plan view (FIG. 7A), a nanowire in perspective view (FIG. 7B), nanowires in cross section (FIGS. 7C, 7D and 7E), and a decomposed nanowire in plan view (FIG. 7F);

FIGS. 8, 9A, 9B, and 10-12 show schematic illustrations of further embodiments of measuring units in which different sensor materials are exposed to the plasma components for use in a lithography apparatus in accordance with FIG. 2, specifically a plurality of nanowires (FIG. 8), silicon dioxide films (FIGS. 9A and 9B, and films measured through reflection (FIG. 10), transmission (FIG. 11) and changes in mass (FIG. 12).

DETAILED DESCRIPTION

Analogous elements or elements having a mutually analogous function have been provided with the same reference signs in the figures, unless indicated to the contrary. In so far as a reference sign has a plurality of reference lines in the present case, this means that the corresponding element is present multiply. Reference sign lines pointing to concealed details are illustrated in a dashed manner. It should also be noted that the illustrations in the figures are not necessarily true to scale.

A system referred to hereinafter as a lithography apparatus should in particular also be understood to also encompass mask inspection systems. Furthermore, consideration is given to a lithography apparatus as simply an example of a general optical apparatus.

Figure 1A:
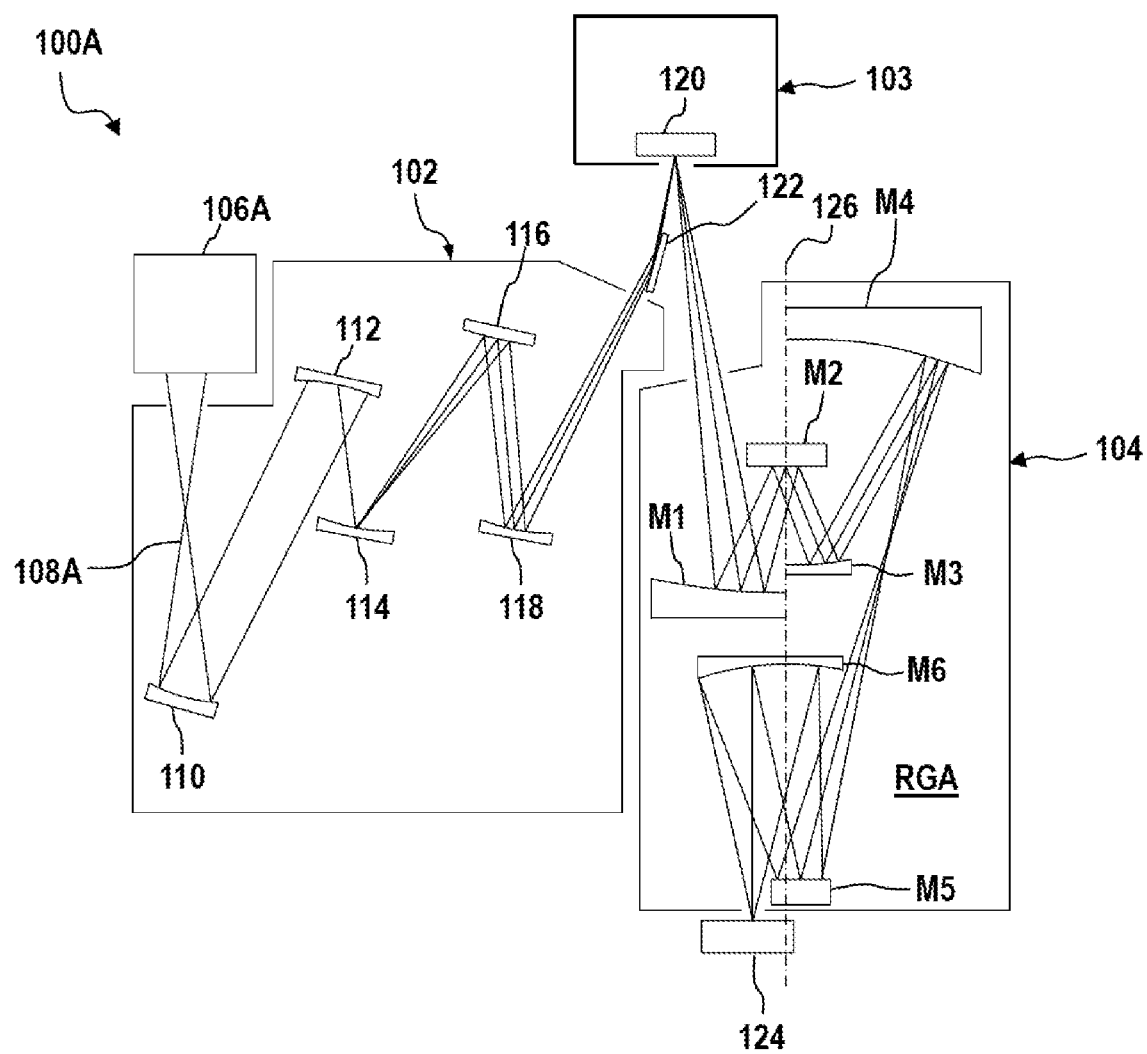
FIG. 1A shows a schematic illustration of one embodiment of an EUV lithography apparatus.

FIG. 1A shows a schematic view of an EUV lithography apparatus 100A, which comprises a beam-shaping and illumination system 102 and a projection system 104. In this case, EUV stands for "extreme ultraviolet" and refers to a wavelength of the working light of between 0.1 nm and 30 nm. The beam shaping and illumination system 102 and the projection system 104 are respectively provided in a vacuum housing (not shown), each vacuum housing being evacuated with the aid of an evacuation device (not shown). In embodiments, the vacuum housings can also communicate with one another. The vacuum housings are surrounded by a machine room (not shown), in which drive devices for mechanically moving or adjusting the optical elements are provided. Furthermore, electronic controllers and the like can also be provided in said machine room.

The EUV lithography apparatus 100A comprises an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated to the greatest possible extent. All that remains is a residual gas atmosphere RGA.

The beam shaping and illumination system 102 illustrated in FIG. 1A has five mirrors 110, 112, 114, 116, 118. After passing through the beam shaping and illumination system 102, the EUV radiation 108A is guided onto a photomask (called a reticle) 120 in a reticle device 103. The photomask 120 is likewise formed as a reflective optical element and can be arranged outside the systems 102, 104. Furthermore, the EUV radiation 108A can be directed onto the photomask 120 by a mirror 122. The photomask 120 has a structure with lithographic information which is imaged onto a wafer 124 or the like in a reduced fashion with the projection system 104 using the EUV light.

The projection system 104 (also referred to as projection lens or projection device) has six mirrors M1 to M6 for imaging the photomask 120 onto the wafer 124. In this case, individual mirrors M1 to M6 of the projection system 104 can be arranged symmetrically in relation to an optical axis 126 of the projection system 104. The number of mirrors M1 to M6 of the EUV lithography apparatus 100A is not restricted to the number illustrated. A greater or lesser number of mirrors M1 to M6 can also be provided. Furthermore, the mirrors M1 to M6 are generally curved on their front face for beam shaping.

Figure 1B:
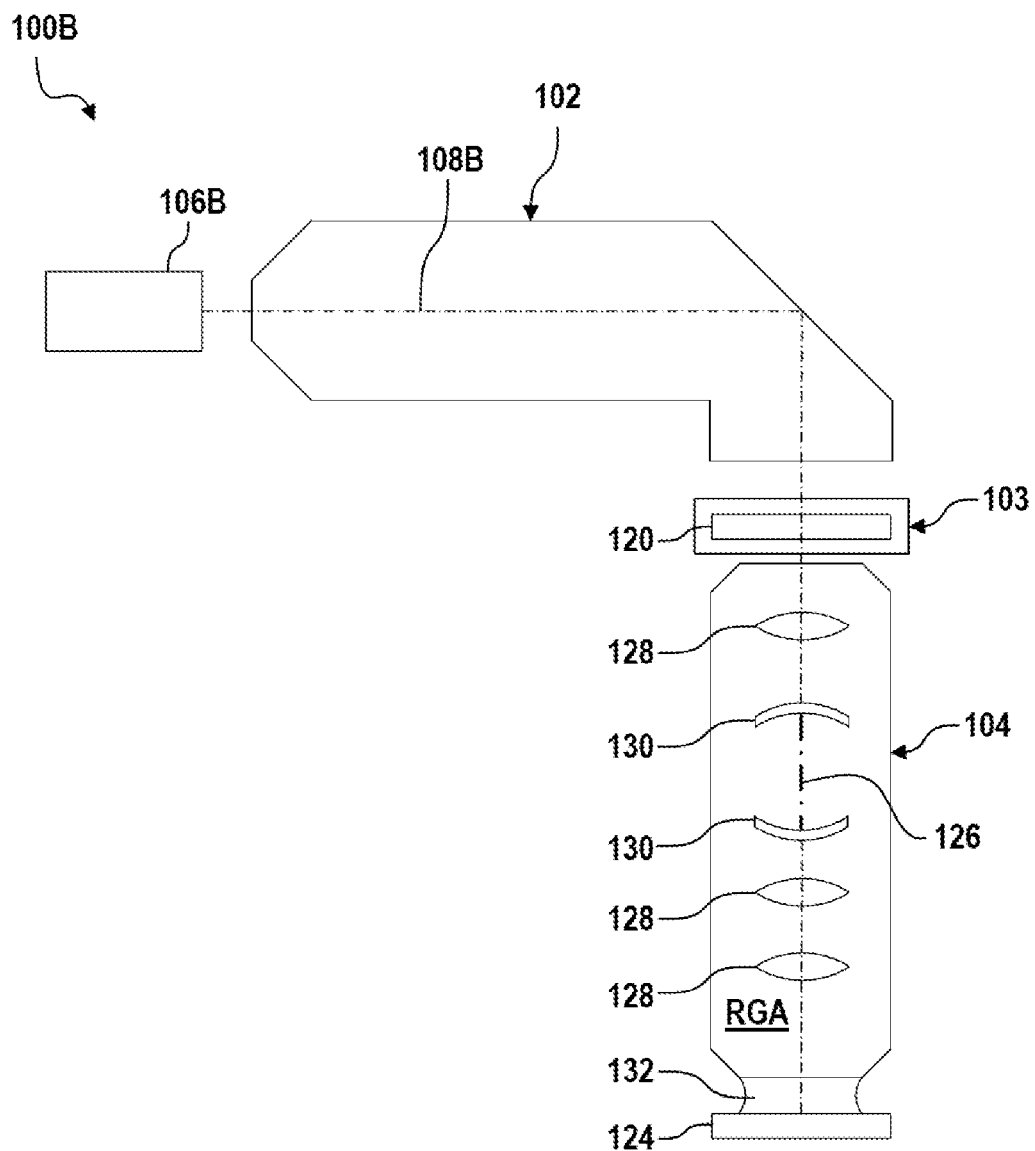
FIG. 1B shows a schematic illustration of one embodiment of a DUV lithography apparatus.

FIG. 1B shows a schematic view of a DUV lithography apparatus 100B, which comprises a beam shaping and illumination system 102 and a projection system 104. In this case, DUV stands for "deep ultraviolet" and refers to a wavelength of the working light of between 30 nm and 250 nm. As has already been described with reference to FIG. 1A, the beam shaping and illumination system 102 and the projection system 104 can be arranged in a vacuum housing and/or surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 arranged in the reticle device 103 is embodied as a transmissive optical element and can be arranged outside the systems 102, 104. The photomask 120 in turn has a structure with lithographic information which is imaged onto a wafer 124 or the like in a reduced fashion with the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. The number of lens elements 128 and mirrors 130 of the DUV lithography apparatus 100B is not restricted to the number illustrated. A greater or lesser number of lens elements 128 and/or mirrors 130 can also be provided. Furthermore, the mirrors 130 are generally curved on their front face for beam shaping.

An air gap between the last lens element 128 and the wafer 124 can be replaced by a liquid medium 132 which has a refractive index of >1. The liquid medium 132 can be high-purity water, for example. Such a construction is also referred to as immersion lithography and has an increased photolithographic resolution. The medium 132 can also be referred to as an immersion liquid.

Gas plasmas are present within the residual gas atmosphere RGA on account of the high-energy UV light, in particular in EUV lithography or mask inspection apparatuses. Hereinafter, by way of example, hydrogen plasma is considered as plasma component in the residual gas atmosphere RGA. The component parts present in the respective lithography or mask inspection apparatus are fabricated partly from materials which are attacked under the influence of the respective plasma component, such as hydrogen plasma. It may be mentioned that a hydrogen-assisted etching process can commence. As a result, volatile material constituents can enter the residual gas atmosphere RGA and precipitate at undesired locations.

One difficulty is, in particular, that silicon as a constituent of mirror or lens element bodies or other structural elements within the lithography or mask inspection apparatus can be incipiently etched under the influence of the hydrogen plasma. The silicon can then precipitate on optical surfaces, e.g. as oxide. On mirror bodies or else optical surfaces, such silicon contaminants can then have undesired influences on the optical properties. By way of example, investigations by the applicant have revealed that the transmission properties of the projection optical unit are impaired by silicon etching processes within lithographic apparatuses and contamination with materials comprising silicon.

That is countered with the aid of the feed of a gas that suppresses this etching process, for example oxygen as gas component. A description is given below of how the metering of the gas component that suppresses the etching process can be carried out expediently on the basis of the example of oxygen gas. Therefore, the following text discusses, in particular, silicon etching and deposition within the residual gas atmosphere RGA with reference to an element material comprising silicon. The etching or chemical processes described can be present analogously at other materials or substances in the lithography or mask inspection apparatus.

The applicant has gained the insight that within the residual gas atmosphere of a lithographic apparatus, a silicon etching process occurs with the occurrence of a precursor, namely a silicon dioxide precursor. Silicon dioxide of this type is also already present, for example, in the above- and below-described mirror mounts or coatings of quartz glass or ULE materials. Corresponding silicon dioxide is firstly reduced to elemental silicon by a hydrogen plasma, said silicon reacting to form silanes $SiH_4$. Water furthermore arises during the reduction process, said water likewise being present in the residual gas atmosphere. Silanes can be broken up under the influence of a catalyst, for example ruthenium, that is likewise present in the residual gas atmosphere, such that silicon and/or, on account of the water and/or oxygen constituents present, silicon dioxide deposit(s). Such deposited layers comprising silicon are considered to be contamination and are regarded in particular as disturbances that adversely influence the optical surfaces.

The corrosive or caustic influence of the hydrogen plasma on component parts containing silicon dioxide as element material can be reduced by the addition of oxygen, water or other oxidants. Therefore, reference is also made to oxygen or water as suppressing gas component. It has been found that oxygen, in particular, shifts the equilibrium of the reduction reaction between silicon dioxide and radical hydrogen from the hydrogen plasma towards the oxidic phase. However, it has likewise been found that the addition of oxygen can have further adverse effects on surfaces of component parts, on account of its oxidation effect.

The reactions possible during a silicon etching process in a residual gas atmosphere of a lithography or mask inspection apparatus are summarized in the following section:

As a result of the influence of the EUV radiation, molecular hydrogen present in the residual gas atmosphere, for example as a purge gas residue, is ionized and converted into plasma components.

$$H_2 + \gamma_{EUV} \rightarrow Hi^+, H^*.$$

Firstly, native silicon dioxide is reduced by the hydrogen plasma components. The silicon dioxide as element material of a component part in the lithography or mask inspection apparatus is subjected to a chemical reduction process in this respect:

$$SiO_2 + 2Hi^+, H^* \rightarrow 2H_2O(g) + Si(s).$$

It is furthermore plausible for the hydrogen plasma to convert the formed silicon and/or silicon from a different source into gaseous silanes:

$$Si(s) + 2Hi^+, H^* \rightarrow SiH_4(g).$$

Reference may be made here to a chemical etching process of the silicon. Silanes can be decomposed under the influence of ruthenium, such that silicon is once again deposited elsewhere, for example on mirror surfaces:

$$SiH_4(g) \rightarrow Si—Ru + 2H_2.$$

The silicon emerging from the reaction is subsequently oxidized by water or oxygen in the residual gas atmosphere to form silicon dioxide, which remains as contamination on the ruthenium:

$$Si—Ru + 2H_2O/O_2 \rightarrow SiO_2.$$

The $SiO_2$ formed and deposited may once again be subjected to a chemical etching process by reduction with the hydrogen plasma constituents, as a result of which silanes again form in the gas phase. The etching rate of thin $SiO_2$ layers on Ru is lower than in the case of $SiO_2$ volume bodies, as a result of which a permanent contamination can be established.

In order then to limit the silicon etching process or the reduction process of silicon dioxide by hydrogen plasma with the aid of addition of oxygen into the residual gas atmosphere, a suitable metering is desired. This is carried out with the aid of the operating method for a lithography apparatus illustrated in FIG. 2, said operating method being explained below on the basis of said lithography apparatus. In this case, as elucidated in FIGS. 5 and 6 on the basis of exemplary flow diagrams, the oxygen feed of a suppressing gas component is controlled in a suitable manner.

Figure 2:
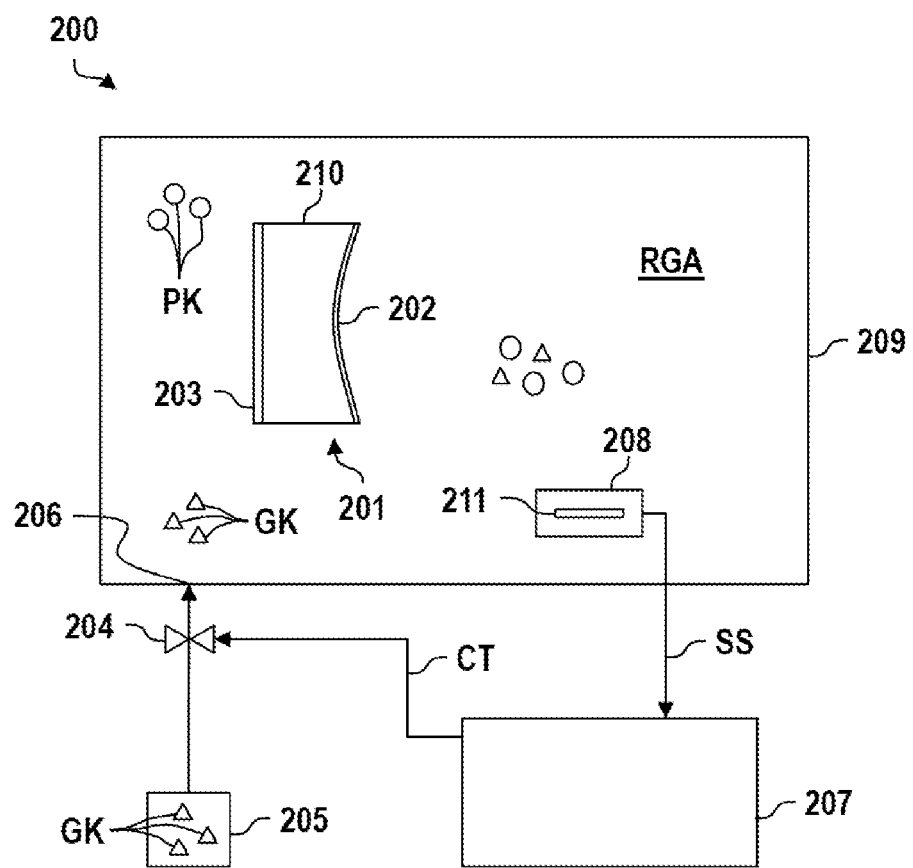
FIG. 2 shows a schematic illustration of a further embodiment of a lithography apparatus for elucidating a method for operating same.

FIG. 2, then, shows one exemplary embodiment of a further lithography apparatus 200. The lithography apparatus 200 illustrated can be understood for example as part of the projection system 104 as illustrated in FIG. 1A of the EUV lithography apparatus (100a). The lithography apparatus 200 comprises a housing 209, which, through suitable vacuum pumps, provides an evacuated atmosphere for the structural elements present within the housing 209. A vacuum having a pressure of between $10^{-4}$ mbar and 2 mbar is preferably generated within the housing 209.

On account of measures not explained any further here, in particular hydrogen as purge gas passes into the residual gas atmosphere RGA that prevails within the housing 209. FIG. 2 indicates that the residual gas atmosphere RGA can comprise plasma components PK, hydrogen plasma being considered here. The hydrogen plasma, represented as small circles, arises as a result of the influence of the EUV radiation used for imaging the lithographic structures, with hydrogen as purge gas, as was explained above.

Furthermore, the lithography apparatus comprises by way of example a structural element designated by 201. The structural element 201 can be e.g. a mirror body fabricated from a glass ceramic or a ULE material. In this respect, a structural element body 210 and a mirror coating 202 are present. EUV mirrors usually comprise multi-layered coatings 202 comprising alternating layers of high and low refractive index layer materials. By way of example, individual layers formed from beryllium, ruthenium, lanthanum, molybdenum and in particular also silicon are used. The hydrogen plasma PK also serves, inter alia, to protect such layers 202 against corrosion. The EUV mirror as structural element 201 mentioned by way of example has, in particular, a surface composed of silicon dioxide 203. This means that silicon dioxide is present in or on the component part 201. Silicon dioxide can be present in particular in mixtures or as native silicon dioxide.

As described above, the silicon dioxide 203 or the layer is under the influence of the plasma component, that is to say the hydrogen plasma PK. This can lead to the etching process indicated above, such that silicon or silicon dioxide adversely deposits elsewhere within the residual gas atmosphere. In order to counteract that, a gas component GK that reduces or decreases this reduction process is introduced into the residual gas atmosphere. This is indicated by the triangles GK. This involves in particular oxygen as gas component GK that decreases the reduction process, "decreasing gas component" for short. To that end, an opening 206 is provided in the housing 209, through which opening oxygen GK from a gas reservoir 205 passes via a controllable valve unit 204 into the interior of the housing 209, that is to say the residual gas atmosphere RGA.

Since it has been found that the addition of oxygen shifts the above-described reduction reaction of the native or present silicon dioxide in the direction of the oxide phase, the reduction process driven by the hydrogen plasma PK can be at least partly prevented, with the result that less chemical etching of silicon subsequently takes place within the residual gas atmosphere.

In order to suitably meter the oxygen feed, a sensor unit 208 is provided within the residual gas atmosphere RGA, said sensor unit supplying a sensor signal SS to a control unit 207. The control unit 207 then controls the valve 204 via a control signal CT depending on the control signal SS. In this case, the sensor unit 208 has a sensor material section 211 that is exposed to the residual gas atmosphere RGA. That is to say that the sensor material section 211 is under the influence of the hydrogen plasma PK and of the oxygen GK fed in.

According to investigations by the applicant, the effect of the oxygen GK, as gas component GK that decreases the reduction process, is dependent on the proportion of the oxygen and/or the hydrogen in the residual gas atmosphere. In this respect, a suppression extent UM is defined, which can be determined by measuring the gas constituents within the residual gas atmosphere. Suppression extent is understood to mean, by way of example, a quantitative description of the etching process, on the one hand, and of the reduction process, on the other hand. One possible choice for the suppression extent UM is the ratio of the amount of oxygen and hydrogen in the residual gas atmosphere RGA or the reduction rate of the sensor material section.

Since such a determination of the gas constituents in the gas phase of the residual gas atmosphere RGA is practically impossible using conventional measures, for example by using a residual gas analyser such as e.g. a mass spectrometer, a suitable sensor unit 208 is introduced into the residual gas atmosphere. The sensor unit 208 enables such a determination of the suppression extent.

Figure 5:
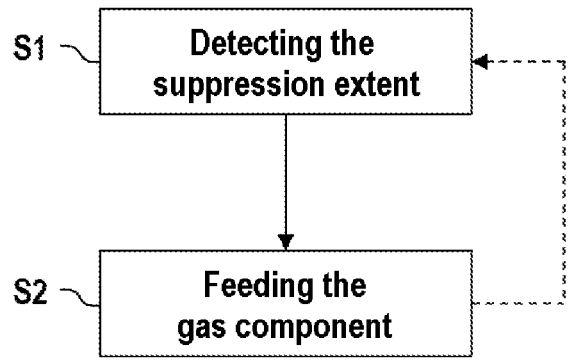
FIGS. 5 and 6 show schematic flow diagrams with method steps for elucidating two exemplary variants of a method for operating a lithography apparatus in accordance with FIG. 2.

As is indicated in FIG. 5, during the operation of the lithography apparatus 200, firstly a detection of the suppression extent is carried out in step S1, that is to say that, by way of example, a ratio of oxygen to hydrogen in the residual gas atmosphere RGA is detected on the basis of the measurement results from the sensor unit 208 in the manner of the sensor signals SS.

Afterwards, in step S2, the oxygen is fed in such that process parameters are established which are expedient for operation and suppression of the reduction process of the silicon dioxide. That is to say that the proportion of oxygen to hydrogen can be considered as the suppression extent UM.

The control unit 207, using the closed-loop or open-loop control of the valve 204, feeds an amount of oxygen GK to the residual gas atmosphere RGA such that the suppression extent UM lies within a specific range.

Figure 3:
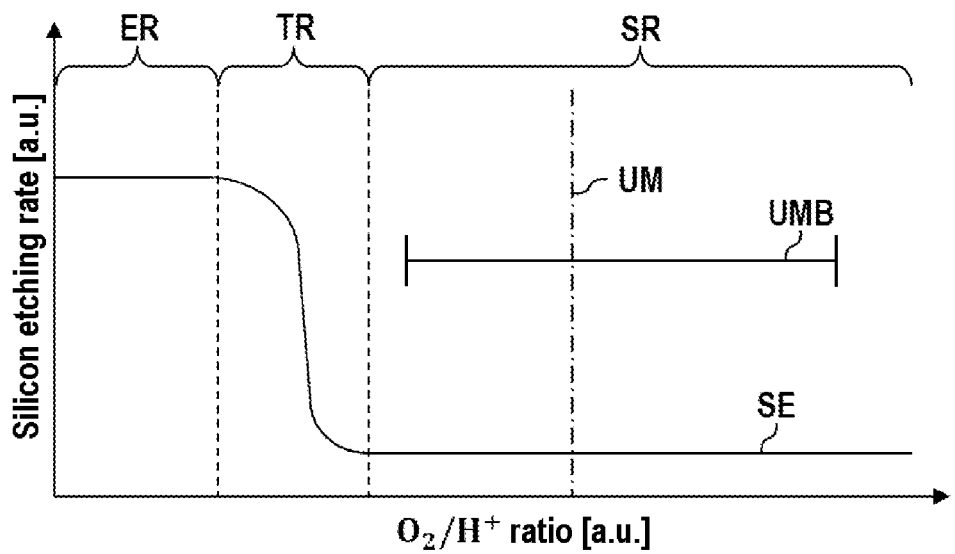
FIG. 3 shows a diagram for elucidating an etching process of silicon with a hydrogen plasma depending on an oxygen-hydrogen ratio in a residual gas atmosphere.

FIG. 3 reproduces an illustration created from investigations by the applicant, which compares the silicon etching rate against the oxygen-hydrogen ratio. The ratio of oxygen $O_2$ to hydrogen ions $H^+$ in arbitrary units is indicated on the x-axis. A qualitative silicon etching rate likewise in arbitrary units is represented on the y-axis. The curve SE shows how the silicon etching rate changes as a function of the $O_2/H^+$ ratio. It can be stated that the $O_2/H^+$ ratio represents a suppression extent UM for the silicon etching or the reduction process—present during the etching process—by the hydrogen plasma.

A high etching rate is present in a range ER of a low $O_2/H^+$ ratio, while a very low silicon etching rate is present in a range of a high $O_2/H^+$ ratio. The transition between these two ranges, namely an etching range or etching regime ER and the suppression range or suppression regime SR, is designated by TR and has a steep progression. That is to say that in the transition range TR the alteration of the suppression extent UM or of the $O_2/H^+$ ratio leads to an increase in the silicon etching.

It is rather desired to leave as few foreign gases, e.g. oxygen, as possible in the UHV region. This is because the oxidative effect of the oxygen fed into the residual gas atmosphere RGA can have further effects on the substances present in the residual gas atmosphere RGA. In particular, a layer oxidation of an underlying silicon layer or barrier, e.g. of the optical coating of the mirrors, can arise, which can likewise impair the transmissive properties of the optical unit. This is taken into account in the metering of the oxygen GK.

The oxygen is then fed (step S2) at least such that the suppression extent UM as $O_2/H^+$ ratio lies in a value range UMB in the suppression regime SR. This preferably takes account of the fact that there is a degree of uncertainty about the suppression extent determined or, in the example in FIG. 3, the ratio of oxygen to hydrogen proportions in the residual gas atmosphere RGA. The suppression extent UM is set by the addition of the oxygen into the residual gas atmosphere such that modulo an uncertainty or tolerance of a measurement of the suppression extent UM by the sensor unit 208 the value of the suppression extent UM lies within the UMB range. It can be stated that the oxygen feed in the step S2 (cf. FIG. 5) is regulated such that the suppression extent always remains in the suppression regime SR. The feeding of the gas component GK is regulated in such a way that the smallest possible value is achieved and that the suppression regime SR continues to be just upheld.

Figure 4:
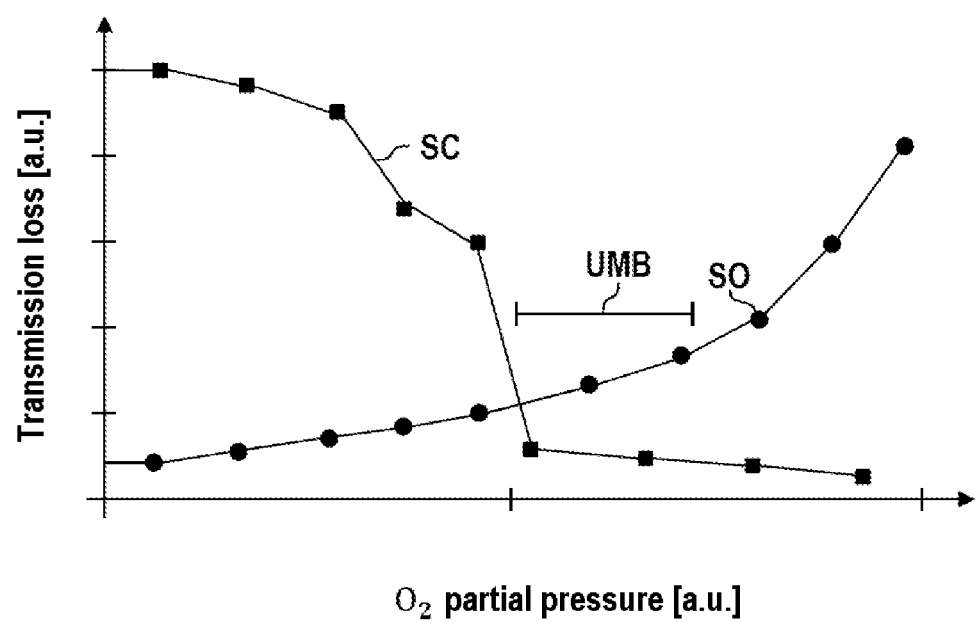
FIG. 4 shows a diagram for elucidating contaminations by silicon in a lithography apparatus depending on an oxygen addition in a residual gas atmosphere.

The applicant carried out further investigations regarding the influence of the silicon contamination in a residual gas atmosphere RGA of a lithography apparatus such as is illustrated schematically in FIG. 2, for example. This involved investigating how the proportion of the oxygen in the residual gas atmosphere, measured in $O_2$ partial pressure, influences the transmission properties of a mirror surface. FIG. 4 reproduces a corresponding diagram. The x-axis indicates the oxygen partial pressure logarithmically in arbitrary units (a.u.) within the residual gas atmosphere RGA with the presence of a hydrogen plasma PK. A transmission loss of a mirror surface of an EUV mirror is indicated on the y-axis. In the investigation, transmission loss is understood to mean the relative loss of light throughput through the entire optical unit relative to the initial value.

In this case, FIG. 4 shows the influence of the silicon etching process and thus of the influence present on account of the precursor reaction, that is to say the reduction of silicon dioxide to silicon by the hydrogen plasma, on the transmissivity of EUV mirrors. The curve SC shows closed squares as measurement points for the silicon etching process. The curve corresponds approximately to the curve SE illustrated in FIG. 3. The curve SO formed from closed circles shows the influence of the oxidative effect of the oxygen within the residual gas atmosphere with regard to the layer oxidation. As indicated above, an increased addition of oxygen can lead to a layer oxidation of the optical coating, which results in a transmission loss that is considered to be disadvantageous. In this respect, by way of example, the $O_2$ partial pressure is set as an alternative suppression extent UM such that the suppression extent UM still lies within a tolerable range for the formation of layer oxide SO, that is to say below a predefined threshold for the curve SO. FIG. 4 indicates such a range UMB. It has been found that the minimum of the combined transmission loss lies on the left in the UMB, that is to say at the smallest possible $O_2$ concentrations which, however, are still just sufficient for the suppression of the etching process.

In order to detect or to determine the suppression extent UM, it is proposed to monitor the influence of the gases present in the residual gas atmosphere RGA, such as, in particular, the hydrogen plasma PK, but also the oxygen GK fed in, with the aid of a sensor unit 208. A direct measurement in the gas phase may be prevented on account of the structural circumstances at the respective component part 201. In this respect, the sensor unit is positioned elsewhere within the residual gas atmosphere RGA, where an identical or similar plasma exposure is preferably present.

Figure 6:
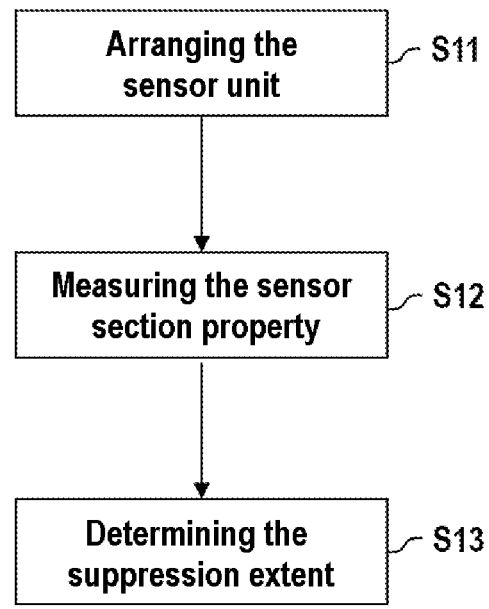

FIG. 6 schematically shows the possible method steps for operating the lithography apparatus 200 with a sensor unit 208, wherein the suppression extent UM is monitored and the oxygen feed is set accordingly. Reference may also be made to a control loop, although the influence of the fed oxygen GK (cf. FIG. 2) on the reductive effect of the hydrogen or of the hydrogen plasma PK takes effect both at the surfaces 203 of the component part 201 and on the sensor material section 211. The control unit 207 controls the valve 204 via control signals CT in such a way that the suppression extent UM lies in the suppression regime SR (cf. FIG. 3) and also below a predefined threshold for the influence of the layer oxide production (cf. FIG. 4). To that end, in a method step S12, the sensor section property is measured preferably regularly over the course of operation of the lithography apparatus 200.

Possible sensor unit configurations and sensor section properties are elucidated in the following FIGS. 7 to 12. From the sensor section property, or the changing sensor section properties, such as, for example, an electrical resistance, the suppression extent UM is deduced by the control unit 207. To that end, by way of example, a calibration curve can be present or a suitable specification for mapping the measured sensor section value onto a suppression extent can be used. By way of example, if the sensor section 211 has a specific resistance, this is mapped onto a suppression extent value. The oxygen feed is then set in such a way that the resistance value measured by the sensor unit 208 lies in a predefined range. This ensures that the metering of the oxygen feed will decrease the contamination on account of a silicon etching process within the residual gas atmosphere RGA.

The following FIGS. 7 to 12 show sensor units in which different sensor materials within the residual gas atmosphere are exposed to the plasma components, such as the hydrogen and/or the gas that suppresses the reduction process, such as oxygen. From the measurement and investigation of the changing sensor material properties, the suppression extent is then determined through suitable mapping.

FIG. 7A shows a first embodiment for a sensor unit 700 such as can be used as sensor unit 208 for example in the lithography apparatus in accordance with FIG. 2. The same applies to the modified sensor units in the subsequent figures as described below.

The sensor unit 700 comprises a nanowire 701 formed from silicon dioxide, said nanowire being coupled to a resistance measurement instrument 703 via contacts 702. The resistance measuring instrument 703 supplies in particular the present resistance of the nanowire 701 to an evaluation unit 704. It is furthermore indicated that the plasma component PK, namely the hydrogen in the lithography apparatus, acts on the silicon dioxide nanowire 701. Corresponding nanowires 701 can be produced in various ways and have in particular diameters of between 10 and 500 nm. They can have for example lengths of between 10 nm and 10 to 100 μm. By way of example, silicon dioxide nanowires are obtained by oxidation of silicon structures.

On account of the influence of the hydrogen plasma PK, the outer surface of the nanowires is reduced to silicon. This is indicated in FIG. 7B, in which a cross section of the nanowire 701 is illustrated and comprises an inner core composed of the silicon dioxide material 705 and a sheath 706 composed of reduced silicon. As a result of the chemical reduction process of the hydrogen at the surface of the nanowire 701, the conductivity or the resistance of the nanowire 701 changes depending on the reactivity of the hydrogen radicals present in the plasma PK. FIG. 7B reveals how the thickness T of the outer cladding 706, which has a lower resistance than the inner silicon dioxide 705, can vary. An electrical measurement in the sensor unit 700, for example a radiofrequency or else direct-current measurement or the respective current-voltage characteristic curve, is used to measure the influence of the plasma PK and the fed oxygen GK in the residual gas atmosphere can be deduced from the resulting resistance or conductance. That is to say that the resistance value can be used as a measure of the suppression extent UM.

In one variant of the embodiment for a sensor unit 700, a silicon nanowire can be used as a sensor material section. This is indicated in FIGS. 7C to 7F. Proceeding from a cross section of a silicon nanowire having the diameter D as illustrated in FIG. 7C, silicon is present for example in amorphous form 708 in the nanowire 707. Under the influence of the oxygen that is introduced as a decreasing gas component GK, into the residual gas atmosphere, the surface of the nanowire 707 oxidizes, as is shown in FIG. 7D, to form silicon dioxide 709. This gives rise to a core-cladding structure comprising an inner silicon region 708 and the outer silicon dioxide surface 709. The altered mechanical and chemical structure of the nanowire 707 results in a variable electrical property, such as, in particular, a changing resistance.

It is possible for the nanowire to be oxidized in such a way that the oxide layer becomes detached from the core, such that, as is shown in FIG. 7E, the nanowire is decreased with respect to its diameter D'. If the nanowire 707 oxidizes further as a result of the oxidation or etching process, the nanowire 707 can completely break or be decomposed in the etching region CR. This is illustrated in FIG. 7F. In the etching region CR, the thickness of the nanowire D2' is thinner than in the preceding figures. If the nanowire 707 breaks, this results in a resistance value of infinite magnitude, which can be detected by the resistance measuring unit 703.

The setting of the original thickness D of a nanowire 707 makes it possible to detect for example the effect or the influence of the oxygen fed to the interior of the lithography apparatus. In an embodiment of the sensor unit such as is shown in FIG. 8, a plurality of nanowires of different diameters can be provided and their electrical properties can be measured and monitored. Therefore, a further embodiment of a sensor unit 800 is illustrated in FIG. 8. Four nanowires 801, 802, 803, 804 are provided, which in each case are contacted via contacts 805 and are monitored by a respective resistance measuring unit 806. The resistance measuring units 806 supply measurement signals to an evaluation unit 807, which in turn supplies a sensor signal SS, for example to the control unit 204 (cf. FIG. 2). It is possible then to use for example the first silicon nanowire with a diameter of 7 nm, the second with 14 nm, the third with 21 nm, and the fourth with 28 nm. With the aid of the measured resistance values or else current-voltage characteristic curves for the respective nanowires 801, 802, 803 and 804, upon respective perforation of the nanowire 801, 802, 803, 804, the oxygen influence on the etching process can be detected in a stepped manner. In particular, in such a circuit it is also possible to combine the sensor variants 7B and 7E in order to enable an improved detection of the suppression extent UM.

Figure 9A:
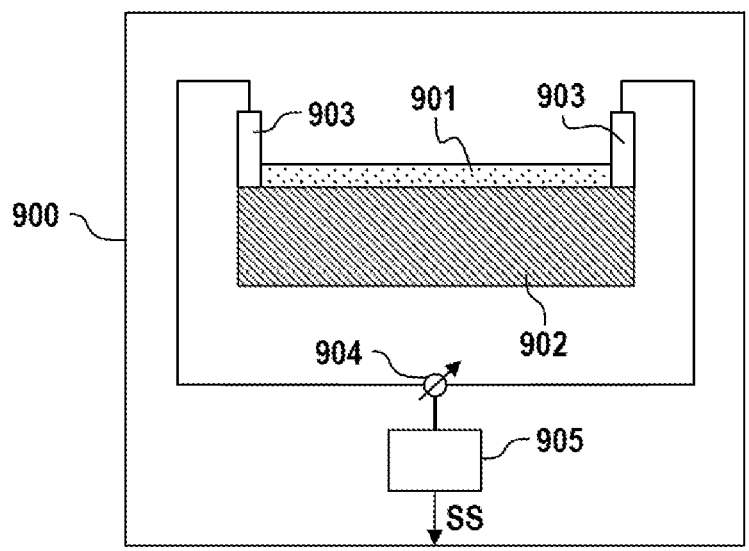

A further embodiment of a sensor unit 900 is illustrated in FIG. 9A. The sensor unit 900 comprises a silicon dioxide film or a layer 901 applied on a substrate 902. The substrate 902 can contain ruthenium, for example. The silicon dioxide film 901 is electrically contacted via contacts 903, such that a resistance value can be detected with the aid of a resistance measuring instrument 904. Once again the resistance, the conductance or a current-voltage characteristic curve that is measured with the current and/or resistance measuring instrument 904 provides information about the effect of the hydrogen or oxygen within the residual gas atmosphere.

The evaluation unit 905 supplies a sensor signal that is fed to the control unit 207 (see FIG. 2).

Figure 9B:
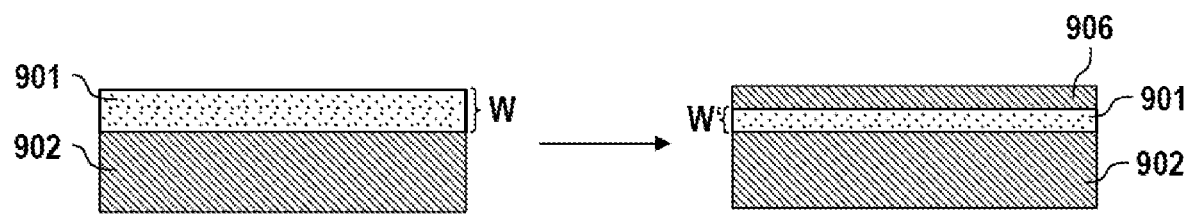
Figure 10:
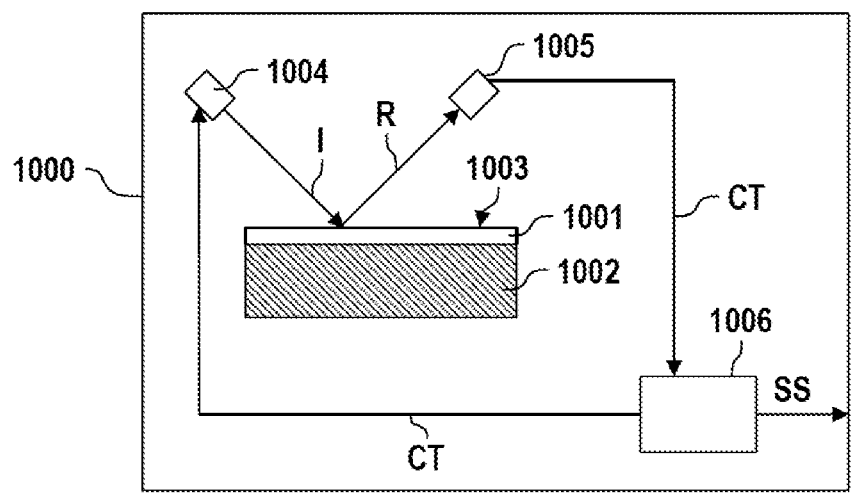

At the surface of the silicon dioxide film 901, a reduction to silicon can take place, in particular, in a manner similar to that at the component parts exposed to corrosion as a result of the hydrogen plasma. This is indicated in FIG. 9B. This reveals the ruthenium substrate 902 with the silicon dioxide layer 901 as sensor section material. The starting point is a thickness W of the silicon dioxide layer 901. Under the influence of the hydrogen radicals of the hydrogen plasma that have a reducing effect, silicon dioxide is reduced at the surface, such that solid silicon 906 is added to the surface. The electrical property that changes as a result, namely the resistance value and/or a conductance or a current-voltage characteristic curve, can be considered as a measure of the effect of the hydrogen concentration in the residual gas atmosphere. FIG. 9B on the right reveals how, in particular, the thickness W' of the silicon dioxide 901 has decreased as a result of the reduction.

Alongside electrical properties of the sensor material used, it is also possible for optical properties of the sensor material to be measured and tested. A further embodiment of a sensor unit is arranged schematically in FIG. 10. The sensor unit 1000 comprises a substrate 1002, which is formed for example from ruthenium and on which a thin material layer 1001 of a few nm to µm is arranged. The material layer 1001 is formed from silicon or silicon dioxide, for example. The sensor unit 1000 furthermore comprises a measuring arrangement comprising an optical emitter 1004 and a receiver 1005, which respectively receive control signals CT from the evaluation unit 1006 and emit them. The optical emitting unit 1004 radiates incident light I onto the surface 1003 of the material layer 1007. Reflected light R is received by the receiving unit 1005.

It is possible, for example, for the measuring arrangement to be configured to carry out ellipsometric investigations. This involves measuring a change in a polarization state of the light I upon the reflection on the surface 1003 of the sensor material layer 1001. Since the surface 1003 changes on account of the hydrogen plasma effect and/or the oxidation effect of the oxygen fed in, a suppression extent UM is able to be derived from the change in the optical properties, for example the ellipsometric parameters ψ and δ. The evaluation unit 1006, likewise illustrated in FIG. 10, supplies a sensor signal SS.

Figure 11:
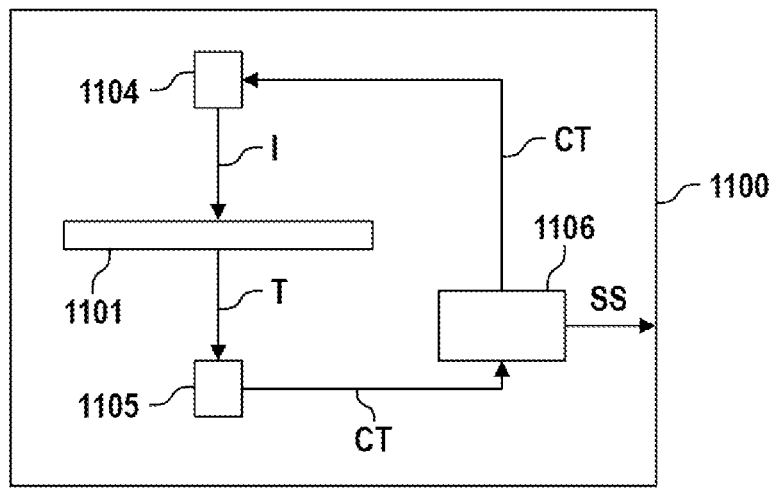

Besides the reflective measurement of the changing sensor material properties, it is also possible to carry out a transmissive measurement. To that end, yet another embodiment of a sensor unit is illustrated in FIG. 11. The sensor unit 1100 comprises a sensor material film 1101, which comprises silicon or silicon oxide, for example. Once again a measuring arrangement comprising an optical emitter 1104 and a receiver 1105 is provided, which emit and/or receive control signals CT and perform a transmission measurement through the thin film 1101, having a thickness of between 5 and 20 nm, for example. The evaluation unit 1106 once again supplies a sensor signal SS for further processing.

Figure 12:
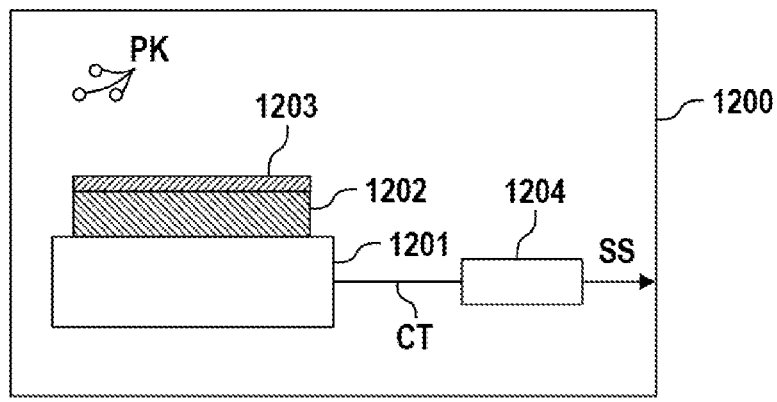

Yet another embodiment of a sensor unit that is suitable for use in a lithography or mask inspection apparatus is illustrated in FIG. 12.

The sensor unit 1200 comprises a quartz crystal microbalance 1201. In the case of the corresponding quartz crystal microbalance 1201, a piezoelectric element such as, for example, a quartz crystal as mass part is caused to oscillate. A resonant frequency is established in accordance with the respective configuration with regard to the dimensioning and mass of the oscillating element. As a result of a change in the mass of the oscillating mass part, the resonant frequency changes as well, which can in turn be detected by an evaluation unit 1204.

A sensor material section, for example in the manner of a substrate layer arrangement, is then applied to the quartz crystal microbalance 1201. In this respect, in the example in FIG. 12, a substrate layer of ruthenium 1202 and a silicon or silicon oxide layer 1203 are applied to the quartz crystal microbalance 1201.

As a result of the reaction with the hydrogen plasma present in the residual gas atmosphere, the mass of the film or of the layer 1203 changes on account of the etching processes and/or the chemical reactions. This results in a change in the resonant frequency of the quartz crystal microbalance 1201, which is in turn detected. In this respect, a change in mass of the sensor section can be detected precisely in an electronic manner. In this case, the change in mass may be brought about in particular by the reduction of silicon oxide to silicon, but also by an oxidation of silicon or an etching of silicon dioxide.

The sensor units illustrated in FIGS. 7 to 12 are suitable in particular for arrangement in the projection device of a lithography apparatus. The proposed measuring or sensor arrangements and units comprising the possible sensor materials allow the suppressing gas component to be determined, without the need to carry out measurements in the gas phase. This is particularly expedient since the structural space within lithography or mask inspection apparatuses is usually limited. The dimensions of the sensors or the areas of the sensor sections are small enough that outgassing from the sensor material sections used can be disregarded.

The proposed sensor units allow detection of the precursor of an etching process of silicon material within lithography or mask inspection apparatus component parts, which leads to a suitable metering of oxygen into the residual gas atmosphere. On account of an adjustment or a calibration of the sensor section properties detected with the aid of the sensor units to a suppression extent UM, the suppression extent can be set suitably in order at least partly to prevent the contamination within the lithography or mask inspection apparatus on account of undesired etching processes.

Although the invention has been explained in greater detail on the basis of exemplary embodiments, it is modifiable in diverse ways. Although the function has been explained on the basis of the example of hydrogen plasmas and oxygen gas components, the contamination of other substances within the residual gas atmosphere as a result of etching processes and/or processes exhibiting reduction precursors can also be prevented. By way of example, contamination with phosphorus or tin constituents is also possible. Although an explanation has been given on the basis of the example of element materials comprising silicon, the corrosion of silicon layers in mirror surfaces is also decreased by the proposed methods and devices. Controlling the feed of suppressing gas components depending on mechanisms of action—detected via sensor units—of the harmful plasmas (in particular hydrogen plasma) in the manner of the suppression extent enables improved operation of the lithography or mask inspection apparatus. Although consideration is given to the example of the projection optical unit of a lithography apparatus in the description, the method can also be used in other vacuum regions or evacuated regions of a lithography or mask inspection apparatus. This applies in particular to the illumination optical unit, the reticle device or in the case of lithography apparatuses in the region of the wafer plane.

It is advantageous, in particular, that a direct residual gas analysis required in the gas phase does not have to be carried out. Said analysis yields only indirect indications, however, such as a partial pressure distribution of $H_2$, $O_2$ and $H_2O$, and moreover requires a reaction model (exhibiting errors) in order that the partial pressure distribution at other locations of the lithography apparatus and also the interaction there between the detected $H_2O$, $O_2$, $H_2$ constituents and, in particular, silicon-containing material (e.g. reduction and etching processes) can be described.

The proposed sensor units allow a direct measurement of the effect or effectiveness of the etching process, and a detailed reaction model is not required. With the aid of the sensor units, it is possible to implement a direct and local measurement variable in particular for the adjustment of oxygen/water metering. By contrast, conventional RGA measurement techniques normally only yield values for the gas composition in the residual gas atmosphere at a specific location of the lithography apparatus. Such measurements of the gas composition are therefore less well suited as measurement variables for the control of local chemical reactions. The proposed measures enable, with the aid of a small, structural-space-saving and comparatively expedient sensor unit, the targeted metering of the suppressing gas component, without having to evaluate the detailed reaction kinetics of the multi-component gas phase and the interaction thereof with the EUV radiation and the element material.

LIST OF REFERENCE SIGNS

100A EUV lithography apparatus
100B DUV lithography apparatus
102 Beam shaping and illumination system
103 Reticle device
104 Projection system
106A EUV light source
106B DUV light source
108A EUV radiation
108B DUV radiation
110 Mirror
112 Mirror
114 Mirror
116 Mirror
118 Mirror
120 Photomask/reticle
122 Mirror
124 Wafer
126 Optical axis
128 Lens element
130 Mirror
132 Medium
200 Lithography apparatus
201 Structural element
202 Coating
203 Reduction layer
204 Valve unit
205 Gas reservoir
206 Feed opening
207 Control unit
208 Sensor unit
209 Housing
210 Structural element body
211 Sensor material section
700 Sensor unit
701 Nanowire
702 Contact
703 Resistance measuring instrument
704 Evaluation unit
705 Material oxide
706 Reduced material oxide
707 Nanowire
708 Nanowire material
709 Nanowire material oxide
800 Sensor unit
801-804 Nanowire
806 Resistance measuring instrument
807 Evaluation unit
900 Sensor unit
901 Sensor material layer
902 Substrate
903 Contact
904 Resistance measuring instrument
905 Evaluation unit
906 Sensor material oxide layer
1000 Sensor unit
1001 Sensor material film
1002 Substrate
1003 Film surface
1004 Emitting unit
1005 Receiving unit
1006 Evaluation unit
1100 Sensor unit
1101 Sensor material film
1104 Emitting unit
1105 Receiving unit
1106 Evaluation unit
1200 Sensor unit
1201 Quartz crystal microbalance
1202 Substrate
1203 Sensor material layer
1204 Evaluation unit
CR Etching region
CT Control signal
D, D1', D" Diameter
ER Etching region
GK Gas component
I Incident light
M1 Mirror
M2 Mirror
M3 Mirror
M4 Mirror
M5 Mirror
M6 Mirror
PK Plasma component
R Reflected light
RGA Residual gas atmosphere
SC Silicon contamination
SE Etching rate
SO Layer oxide
SR Suppression range
SS Sensor signal
S1 Detecting the suppression extent
S2 Feeding the suppressing gas component
S11 Arranging the sensor unit
S12 Measuring the sensor section property
S13 Determining the suppression extent
T Transmitted light
TR Transition range
UM Suppression extent
UMB Suppression extent range
W, W' Thickness

What is claimed is:

1. Method for operating an optical apparatus, comprising:
arranging a structural element in a residual gas atmosphere of the optical apparatus, which is formed at least partly from an element material which is subjected to a chemical reduction process and/or an etching process with a plasma component present in the residual gas atmosphere;
feeding a suppressing gas component that at least partly suppresses the reduction process and/or the etching process depending on a detected suppression extent for suppressing the reduction process and/or the etching process by the suppressing gas component in the residual gas atmosphere;

detecting the suppression extent with a sensor unit arranged in the residual gas atmosphere, wherein the detecting is based on a sensor section property of a sensor material of a sensor material section of the sensor unit that is measurable under influence of the suppressing gas component; and effecting a material removal or a material supplementation such that the sensor material is etched, reduced or oxidized under the influence of the plasma component and the suppressing gas component in the sensor material section.

2. Method according to claim 1, wherein the sensor section property is an electrical conductivity of the sensor material section, a thickness of the sensor material section on a substrate, an optical reflection and/or a transmission coefficient and/or a mass of the sensor material section.

3. Method according to claim 1, further comprising:
measuring the sensor section property; and
determining a substance amount to be fed of the suppressing gas component in the residual gas atmosphere depending on the measured sensor section property for detecting the suppression extent.

4. Method according to claim 1, wherein the suppression extent is detected as a ratio of proportions of the plasma component and the suppressing gas component in the residual gas atmosphere.

5. Method according to claim 1, further comprising:
measuring the sensor section property;
mapping the measured sensor property with
a) a mapping specification,
b) a reaction model for the influence of the suppressing gas component and/or the plasma component on the sensor material and/or the element material,
c) a heuristic model for the influence of the suppressing gas component and/or the plasma component on the sensor material and/or the element material and/or
d) a table
onto the suppression extent.

6. Method according to claim 1, wherein feeding the suppressing gas component comprises determining that the detected suppression extent lies within a predefined range during operation of the optical apparatus.

7. Method according to claim 6, wherein the predefined range is selected to at least partly prevent an etching process of the element material reduced on account of the reduction process.

8. Method according to claim 1, wherein the optical apparatus comprises at least one optical element having a mirror surface, wherein the suppressing gas component is an oxidant, and wherein feeding the suppressing gas component comprises depositing element material oxidized by the suppressing gas component and previously reduced by the plasma component to an extent smaller than a predefined extent.

9. Method according to claim 1, wherein the optical apparatus is a lithography apparatus which comprises an illumination device for generating ultraviolet (UV) light, a reticle device for a photomask with lithographic information, and a projection device for imaging the lithographic information onto a wafer, and wherein the sensor unit is arranged in the projection device.

10. Method according to claim 1, wherein the optical apparatus is a mask inspection apparatus which comprises an illumination device for generating UV light, a reticle device for a photomask with lithographic information, and a projection device for imaging and for inspecting the lithographic information, and wherein the sensor unit is arranged in the projection device.

11. Method according to claim 1, wherein the structural element is an optical element, a mirror body, a mirror coating, a reticle mount and/or a carrying element.

12. Method according to claim 1, wherein the element material is selected from the group consisting of: an oxide material, a glass material, a ULE material, a zinc oxide, amorphous or crystalline silicon and a silicon carbide.

13. Method according to claim 1, wherein the plasma component comprises hydrogen.

14. Method according to claim 1, wherein the gas component that suppresses the etching and/or the reduction process comprises oxygen and/or water.

15. Optical apparatus comprising:
a housing closing off a residual gas atmosphere;
a structural element which is arranged in the residual gas atmosphere and which is formed at least partly from an element material which is subjected to a chemical reduction process and/or an etching process with a plasma component present in the residual gas atmosphere;
a feed unit arranged to feed a suppressing gas component that at least partly suppresses the reduction process and/or the etching process into the residual gas atmosphere; and
a sensor unit arranged in the residual gas atmosphere and comprising a sensor material section composed of a sensor material, wherein the sensor material section has a measurable sensor section property that varies under influence of the suppressing gas component, and wherein the sensor material is configured to be etched, reduced or oxidized under the influence of the plasma component and the suppressing gas component in the sensor material section.

16. Optical apparatus according to claim 15, further comprising a control unit configured to control the feed unit.

17. Optical apparatus according to claim 15, wherein the sensor unit comprises a variable-resistance nanowire fabricated from the sensor material as the sensor material section and a measuring unit for measuring an electrical resistance of the nanowire as the sensor section property, wherein the sensor material is configured to be oxidized by the suppressing gas component to form a sensor material oxide.

18. Optical apparatus according to claim 17, wherein the nanowire is configured such that the sensor material oxide is stripped from the sensor material.

19. Optical apparatus according to claim 15, wherein the sensor unit comprises a variable-resistance thin layer fabricated from the sensor material and arranged on a substrate as the sensor material section and a measuring unit for measuring an electrical resistance of the thin layer as the sensor section property, wherein the sensor material is configured to be oxidized by the suppressing gas component to form a sensor material oxide.

20. Optical apparatus according to claim 15, wherein the sensor unit comprises a film fabricated from the sensor material as the sensor material section and a measuring unit for measuring an optical property as the sensor section property.

21. Optical apparatus according to claim 20, wherein the sensor material is configured to be oxidized by the suppressing gas component to form a sensor material oxide.

22. Optical apparatus according to claim 20, wherein the sensor material is configured to be reduced under the influence of the plasma component.

23. Optical apparatus according to claim 20, wherein the sensor unit is configured to determine ellipsometric parameters for a surface of the film as the sensor section property and/or to measure an optical transmission property of the film as the sensor section property.

24. Optical apparatus according to claim 15, wherein the sensor unit comprises a quartz crystal microbalance for measuring a sensor material removal from or supplementation to the sensor section under the influence of the suppressing gas component and/or the plasma component on the sensor material.

25. Optical apparatus according to claim 24, wherein the quartz crystal microbalance comprises a ruthenium, palladium, platinum or rhodium layer coated with silicon oxide.

26. Optical apparatus according to claim 24, wherein the residual gas atmosphere has a pressure of between $10^{-4}$ and 5 mbar.

27. Optical apparatus according to claim 15, wherein a partial pressure of the suppressing gas component is between $10^{-10}$ and $10^{-7}$ mbar.

28. Optical apparatus according to claim 15, further comprising a projection device configured to image lithographic information with extreme ultraviolet (EUV) radiation.

29. Optical apparatus comprising:
a housing closing off a residual gas atmosphere;
a structural element which is arranged in the residual gas atmosphere and which is formed at least partly from an element material which is subjected to a chemical reduction process and/or an etching process with a plasma component present in the residual gas atmosphere;
a feed unit arranged to feed a suppressing gas component that at least partly suppresses the reduction process and/or the etching process into the residual gas atmosphere; and
a sensor unit arranged in the residual gas atmosphere and comprising a sensor material section composed of a sensor material, wherein the sensor material section has a measurable sensor section property that varies under influence of the suppressing gas component,
wherein the sensor unit comprises a variable-resistance nanowire fabricated from the element material as the sensor material as the sensor material section and a measuring unit arranged to measure an electrical resistance of the nanowire as the sensor section property, wherein the sensor material is configured to be reduced under the influence of the plasma component.

* * * * *

UNITED STATES PATENT AND TRADEMARK OFFICE
CERTIFICATE OF CORRECTION

PATENT NO. : 11,307,505 B2
APPLICATION NO. : 16/790107
DATED : April 19, 2022
INVENTOR(S) : Becker et al.

It is certified that error appears in the above-identified patent and that said Letters Patent is hereby corrected as shown below:

On the Title Page

Page 2, item (56) under "OTHER PUBLICATIONS", Line 2, delete "hydrogena"," and insert -- hydrogen", --.

In the Specification

Column 2, Lines 52-58, delete "detecting the suppression extent with the aid of a sensor unit arranged in the residual gas atmosphere, said sensor unit comprising a sensor material section composed of a sensor material, wherein the sensor material section has a sensor section property that is measurable under the influence of the suppressing gas component." and insert the same on Column 2, between Lines 53 and 54 as a new paragraph.

Column 7, Line 25, delete "1" and insert -- 1 µm, --.

Column 10, Line 28, delete "9B," and insert -- 9B), --.

Column 17, Line 58, delete "radiofrequency" and insert -- radio-frequency --.

Signed and Sealed this
Fifteenth Day of November, 2022

Katherine Kelly Vidal
*Director of the United States Patent and Trademark Office*